US006991970B2

(12) United States Patent
Fogal et al.

(10) Patent No.: US 6,991,970 B2
(45) Date of Patent: Jan. 31, 2006

(54) METHOD AND APPARATUS FOR CIRCUIT COMPLETION THROUGH THE USE OF BALL BONDS OR OTHER CONNECTIONS DURING THE FORMATION OF SEMICONDUCTOR DEVICE

(75) Inventors: Rich Fogal, Boise, ID (US); Tracy Reynolds, Kuna, ID (US); Timothy Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 103 days.

(21) Appl. No.: 09/945,084

(22) Filed: Aug. 30, 2001

(65) Prior Publication Data

US 2003/0045026 A1    Mar. 6, 2003

(51) Int. Cl.
H01L 21/82    (2006.01)
(52) U.S. Cl. .................. 438/128; 438/129; 438/131; 438/132
(58) Field of Classification Search ............... 438/612, 438/613, 617, 119, 128, 129, 130, 131, 132, 438/598, 599, 600, 601; 365/96, 225.7
See application file for complete search history.

(56) References Cited

U.S. PATENT DOCUMENTS

| 5,110,754 | A |   | 5/1992  | Lowrey et al.  | 437/52   |
|-----------|---|---|---------|----------------|----------|
| 5,241,496 | A |   | 8/1993  | Lowrey et al.  | 365/96   |
| 5,324,681 | A |   | 6/1994  | Lowrey et al.  | 437/52   |
| 5,331,196 | A |   | 7/1994  | Lowrey et al.  | 257/529  |
| 5,345,110 | A |   | 9/1994  | Renfro et al.  | 307/272.3|
| 5,838,625 | A | * | 11/1998 | Cutter et al.  | 365/225.7|
| 5,898,217 | A | * | 4/1999  | Johnston       | 257/691  |
| 5,973,978 | A | * | 10/1999 | Cutter et al.  | 365/225.7|
| 6,078,100 | A |   | 6/2000  | Duesman et al. | 257/690  |
| 6,087,707 | A |   | 7/2000  | Lee et al.     | 257/530  |
| 6,088,282 | A |   | 7/2000  | Loughmiller et al. | 365/225.7 |
| 6,094,065 | A | * | 7/2000  | Tavana et al.  | 326/39   |
| 6,094,388 | A |   | 7/2000  | Cowles         | 365/201  |
| 6,097,098 | A |   | 8/2000  | Ball           | 257/786  |

(Continued)

FOREIGN PATENT DOCUMENTS

JP    6-232537    *    8/1994

OTHER PUBLICATIONS

Synchronous DRAM 64Mb: x4, x8, x16 SDRAM, Micron Technology, Inc., p. 65-Rev D; Pub. May 2001.

(Continued)

Primary Examiner—W. David Coleman
Assistant Examiner—Khiem D. Nguyen
(74) Attorney, Agent, or Firm—Kevin D. Martin (57) ABSTRACT

A method used to form a semiconductor device comprises providing first and second circuit portions having first and second pad portions respectively. The second circuit portion is electrically isolated from the first circuit portion. The first and second pad portions are then electrically connected, for example with a ball bond or a wire bond, to electrically couple the first and second circuit portions. In various embodiments the semiconductor device will not function until the pad portions are electrically coupled, and in other embodiments the functionality of the device may be selectively controlled by connecting selected pad portions from a plurality of pad portions. Isolating the first and second circuit portions allows electrical operations such as antifuse programming to be carried out without adversely affecting related circuits. Once electrical operations are completed, the isolated circuit portions are electrically coupled to provide a complete circuit. Various inventive embodiments and implementations are described.

14 Claims, 8 Drawing Sheets

U.S. PATENT DOCUMENTS

| | | | |
|---|---|---|---|
| 6,108,260 A | 8/2000 | Casper | 365/225.7 |
| 6,154,851 A | 11/2000 | Sher et al. | 714/5 |
| 6,169,329 B1 | 1/2001 | Farnworth et al. | 257/780 |
| 6,169,331 B1 | 1/2001 | Manning et al. | 257/784 |
| 6,271,574 B1 * | 8/2001 | Delpech et al. | 257/529 |
| 6,320,242 B1 * | 11/2001 | Takasu et al. | 257/529 |
| 6,423,582 B1 * | 7/2002 | Fischer et al. | 438/132 |
| 6,555,458 B1 * | 4/2003 | Yu | 438/601 |
| 6,607,945 B2 * | 8/2003 | Tsui | 438/132 |
| 6,753,210 B2 * | 6/2004 | Jeng et al. | 438/132 |
| 6,774,456 B2 * | 8/2004 | Rusch et al. | 257/529 |
| 6,809,398 B2 * | 10/2004 | Wang | 257/530 |
| 2002/0017729 A1 * | 2/2002 | Macpherson | 257/784 |
| 2002/0020058 A1 * | 2/2002 | Saito et al. | |
| 2004/0012071 A1 * | 1/2004 | Ido et al. | 257/529 |
| 2004/0209404 A1 * | 10/2004 | Wang et al. | 438/132 |

OTHER PUBLICATIONS

Synchronous DRAM 64Mb: x32 SDRAM, Micron Technology, Inc., p. 65-Rev. Sep. 2000.

Synchronous DRAM 128Mb: x4, x8, x16 SDRAM, Micron Technology, Inc., p. 65-Rev. E; Pub. May 2001.

* cited by examiner

| A6 | A5 | A4 | LATENCY |
|----|----|----|---------|
| 0  | 0  | 1  | 1       |
| 0  | 1  | 0  | 2       |
| 0  | 1  | 1  | 3       |

METHOD AND APPARATUS FOR CIRCUIT COMPLETION THROUGH THE USE OF BALL BONDS OR OTHER CONNECTIONS DURING THE FORMATION OF SEMICONDUCTOR DEVICE

FIELD OF THE INVENTION

This invention relates to the field of semiconductor manufacture and, more particularly, to a method for customizing the functionality of a semiconductor device after probe and before assembly through the use of a ball bond, wire bond, or other electrical connection.

BACKGROUND OF THE INVENTION

The manufacture of semiconductor devices such as dynamic random access memories (DRAM), static random access memories (SRAM), microprocessors, and logic devices involves a number of complex processing steps. While great care is taken during processing to ensure the steps are identical between each manufacturing lot of wafers, variability between lots, between wafers within a lot, and between dice on a single wafer commonly occurs. This processing variability results in differences in electrical performance of completed semiconductor dice.

The functionality and electrical performance of each die is measured at probe. This testing occurs at the wafer level subsequent to wafer processing and before the wafer is diced to separate each die prior to packaging. During wafer testing various semiconductor dice are found to be fully functional, some are not functional and not repairable, while others are not functional but may be repairable, depending on their failure mode. For example, if one or more storage elements of a row or column of storage capacitors is nonfunctional, a row or column of functional storage capacitors may be substituted through the use of fuse or antifuse (fusible link) devices. The following US patents, each assigned to Micron Technology, Inc. and incorporated herein as if set forth in their entirety, describe the formation and use of antifuse devices: U.S. Pat. No. 6,108,260 issued Aug. 22, 2000; U.S. Pat. No. 6,088,282 issued Jul. 11, 2000; U.S. Pat. No. 6,087,707 issued Jul. 11, 2000; U.S. Pat. No. 5,345,110 issued Sep. 6, 1994; U.S. Pat. No. 5,331,196 issued Jul. 19, 1994; U.S. Pat. No. 5,324,681 issued Jun. 28, 1994; U.S. Pat. No. 5,241,496 issued Aug. 31, 1993; 5,110,754 issued May 5, 1992.

Antifuses are commonly fabricated with a structure similar to that of a capacitor. Two conductive electrical terminals are separated by a dielectric layer. An unprogrammed "off" state, in which the antifuse is fabricated, presents a high resistance between the antifuse terminals (i.e. the terminals are electrically isolated from each other). The antifuse may also be programmed to an "on" state in which a low resistance connection between the antifuse terminals is provided (i.e. the terminals are electrically coupled or connected). To program or "blow" an antifuse to the "on" state, a large programming voltage is applied across the antifuse terminals, breaking down the interposed dielectric and forming a conductive link between the antifuse terminals. When an antifuse device is programmed "on," it is selected to replace a nonfunctional storage capacitor row or column with a functional row or column.

Figure 1:
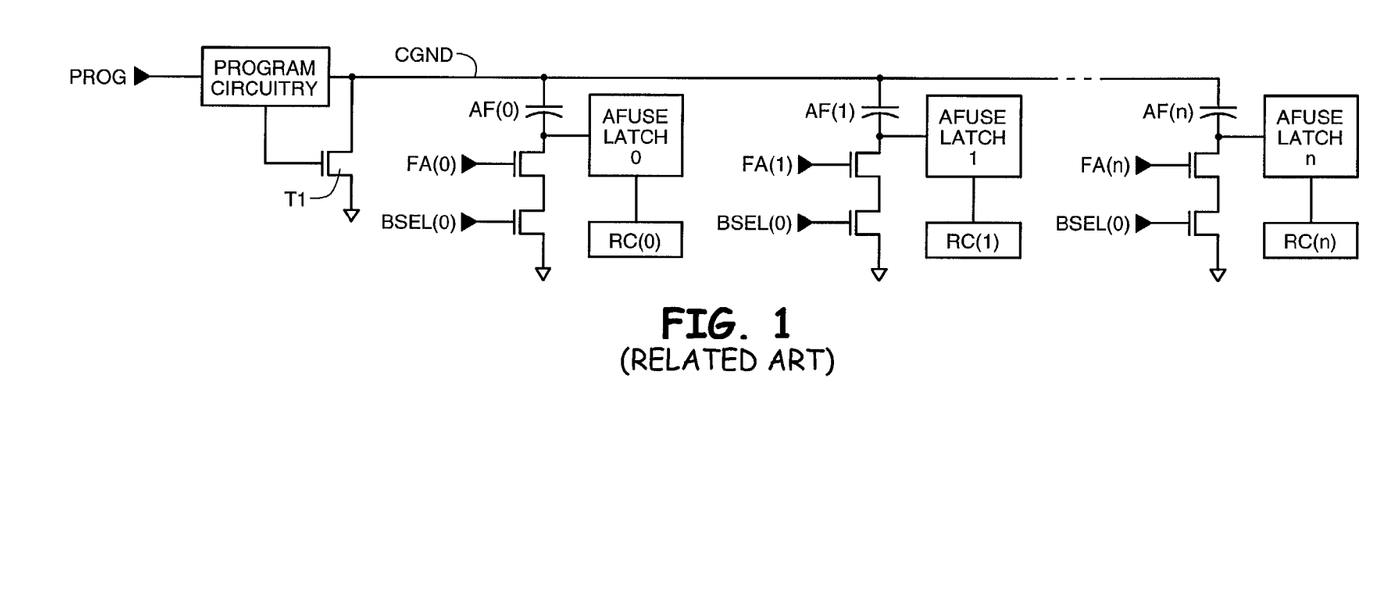
FIG. 1 is a block diagram depicting conventional antifuse circuitry.

FIG. 1 depicts a simplified diagram of a conventional arrangement of antifuse devices and other supporting circuitry. To program an antifuse device, for example device AF(0) (antifuse 0), the proper fuse address is output to FA(0) (fuse address 0), which typically comprises 8 or more address bits. This activates the transistor coupled with FA(0). The bank comprising AF(0) is selected by activating BSEL(0) (bank select 0) which activates all transistors associated with the BSEL(0) signal. With both FA(0) and BSEL(0) activated, the lower plate of AF(0), depicted as a curved line, is tied to ground while the lower plates of the remaining antifuses, which likely number in the thousands, are not tied to ground. Finally, to program AF(0), PROG is taken to a "high" state which, through program circuitry, ties CGND to a selected high voltage, for example 7 volts, and sends a "low" state to transistor T1. The high voltage on CGND is maintained for a period of time required to blow the fuse, which is dependent on the voltage applied to CGND. The upper plate of AF(0), depicted as a straight line, as well as the upper plates of the remaining antifuses, therefore, have the programming voltage applied thereto. With a high voltage applied to the upper plate of AF(0) and the lower plate tied to ground, the dielectric interposed between the two plates breaks down and the resistance between two plates is decreased such that the plates, in effect, are shorted together. A column decoder (not depicted) redirects the address from the nonfunctional column (not depicted) to the redundant column RC(0) associated with AF(0). Thus the antifuse latch AFUSE LATCH (0) associated with AF(0) is activated during operation of the memory device on powerup, and the redundant column RC(0) associated with AF(0) replaces a nonfunctional column. A similar arrangement is implemented to replace a nonfunctioning row with a redundant row.

As stated above, when the device is in program mode (PROG high), the Program Circuitry outputs a low to transistor T1 and a program voltage is applied to CGND. When the device is in normal operational mode, the Program Circuitry outputs a high to transistor T1 to tie CGND to ground for proper operation.

As semiconductor device manufacturing technology improves and storage capacitors continue to decrease in size, problems may result from the use of antifuse devices. One problem which may occur results from the voltage required to program the anti fuse. The voltage must be high enough to break down the dielectric between the antifuse plates in a reasonable amount of time. With the large number of antifuse devices which must be programmed with conventional memory devices, often numbering in the thousands, the voltage must be maintained at a fairly high level. As the feature size of semiconductor devices decreases with future device generations, the voltage required to program the antifuse may exceed the junction breakdown voltage of transistor T1. Thus the optimum voltage applied to CGND to program the antifuse will not be obtained because any voltage above the breakdown voltage of T1 can bleed to the substrate and pull down the CGND network of devices. Further, a high voltage over an extended period of time may adversely affect other devices which have a common active area which need to be connected to the CGND node for normal operation.

After functional testing and device repair using row and/or column redundancy in a conventional device, fully functional devices are speed graded and otherwise tested. After wafer-level testing is completed, the semiconductor wafer is diced to singularize each semiconductor die from other dice. Each functional die is assembled, for example including attachment to a lead frame and encapsulation in plastic, while nonfunctional dice are discarded.

A semiconductor device such as a DRAM comprises various default configurations which may be altered before encapsulation using bond options. For example, devices are typically manufactured for a "by 1" (×1) data width, such that only one data out line (DQ) is active to supply one data bit for each read cycle. Before encapsulation, the data width for the device can be changed by wire bonding together a "bond option pad" to a lead frame lead finger which is also electrically coupled with $V_{CC}$ or GND to modify its configuration. By using these "bond options" the device data width may be modified to a ×8 configuration, a ×16 configuration, a ×32 configuration, etc. Thus the device is manufactured to function in one manner if no bond options are selected, and will function in another manner if one or more bond options are selected.

Thus with conventional devices the ball bond is a first end of a bond wire and is attached to a bond pad of the die. A second end of the bond wire is attached to a lead finger of the lead frame, then the lead finger and die are encapsulated or otherwise packaged. In use, the lead is electrically coupled with power or ground, which determines how the die functions. The functionality of the die, therefore, is determined by a source external to the die, as the die will function one way if the lead is coupled with power, and another way if it is coupled with ground. Whether the lead will be coupled with power or ground is determined before the wire bond is connected, but the actual functionality depends on whether the lead is connected with power or ground.

Various other device parameters are a function of their processing and cannot typically be modified. These include internal power bus configurations or connecting/disconnecting internal circuitry. In such cases different photolithography masks would typically be required to modify circuit behavior or to modify power busing architecture. Mask sets can be expensive, require several weeks to manufacture, and add to semiconductor device manufacturing costs.

A method and structure which overcomes the problems described above and which allows for the modification of semiconductor device parameters not previously selectable in a manner not previously available would be desirable.

SUMMARY OF THE INVENTION

The present invention provides a new method which, among other advantages, allows for the selection of semiconductor device parameters prior to encapsulation using one or more ball bond, wire bond, or other connection approaches. In accordance with one embodiment of the invention a semiconductor device is manufactured having a circuit which is separated into two or more segments. The circuit may be designed in a number of different embodiments to control various and diverse device parameters, for example including device latency, aspects of antifuse operation, device density (such as selecting a device to operate as a 64 megabit or 128 megabit device), and various power functions. The circuit further includes at least first and second adjacent conductive pad portions which may be electrically coupled using a ball bond or wire bond. These conductive pad portions are not accessible through the final package lead fingers.

In various embodiments of the invention, the semiconductor device will not function unless two or more of the adjacent conductive pads are shorted together. In other embodiments of the invention the semiconductor device will function in one manner if the adjacent pads are not shorted together, and will function in another manner if the pads are shorted together.

Additional advantages will become apparent to those skilled in the art from the following detailed description read in conjunction with the appended claims and the drawings attached hereto.

BRIEF DESCRIPTION OF THE DRAWINGS

FIGS. 2A–7 depict various arrangements for conductive pads which provide circuit segment terminations;

It should be emphasized that the drawings herein may not be to exact scale and are schematic representations. The drawings are not intended to portray the specific parameters, materials, particular uses, or the structural details of the invention, which may be determined by one of skill in the art by examination of the information herein.

DETAILED DESCRIPTION OF THE PREFERRED EMBODIMENT

A semiconductor device manufactured in accordance with one embodiment of the invention comprises a semiconductor wafer substrate assembly which may be an entire undiced semiconductor wafer or other large scale semiconductor substrate, two or more unsegmented semiconductor dice, or a single semiconductor die. Any of the foregoing may be hereinafter referenced as a "wafer section." The substrate assembly comprises an electrical circuit segmented into two or more separate parts or portions, with each circuit portion electrically isolated from the other. Each circuit segment terminates in a conductive pad or "mini-pad" which is physically located near the mini-pad of the other circuit segment. The pads are arranged to facilitate their electrical attachment, which shorts together the two separate circuit parts and facilitates completion of the circuit.

In various other embodiments more than two circuit portions and corresponding mini-pads may be used. Further, the circuits portions may each be complete circuits which function in one manner if the mini-pads are not electrically connected, and will function in another manner if the mini-pads are electrically connected.

FIGS. 2A–7 depict several pad layouts which terminate each of at least two unconnected portions of a circuit. As depicted in FIGS. 2A–7, a ball bond may be used to electrically couple adjacent pads, although a wire bond, screen printed conductive paste such as a conductive epoxy, and tape automated bonding assemblies comprising electrical traces on flexible dielectric substrates may also function sufficiently.

Figure 2A:
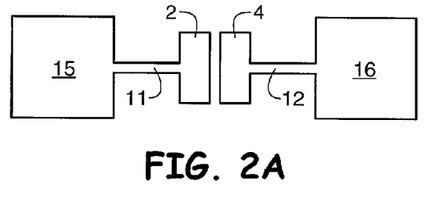
Figure 2B:
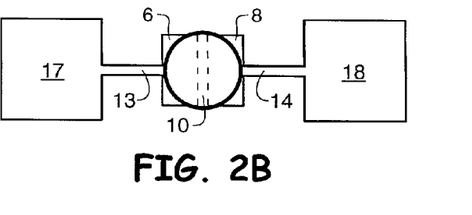

FIG. 2A depicts two adjacent unconnected pads (minipads) 2, 4 which are in close proximity to each other to facilitate their connection using a ball bond. FIG. 2B depicts two additional pads 6, 8, which are unrelated to pads 2, 4, electrically coupled to each other using a ball bond 10. Each pad 2, 4, 6, 8 has associated therewith a unique conductive runner 11, 12, 13, 14 which electrically couples each pad with a respective circuit portion 15, 16, 17, 18 depicted in block form for simplicity of explanation. Thus by providing a ball bond 10 which electrically connects pad 6 with pad 8, two halves of the circuit are electrically connected and the circuit is completed. Various circuit embodiments are described below, however this connection will typically be manufactured after probe, after dicing of the wafer, and before encapsulation or other assembly of the semiconductor die. Various processes, however, may require connection prior to dicing the wafer prior to encapsulation.

With current technology, gold, copper, palladium, aluminum, platinum, or tin-lead ball bonds as small as two mils in diameter may be manufactured, and the technology will likely improve to allow for ball bonds having even smaller diameters in the future. In the embodiment of FIGS. 2A and 2B, each pad is two mils in length and 0.95 mils in width, with a 0.1 mil spacing between each pad. Thus the perimeter of the two pads combined measures two mils square. Such a structure can easily be manufactured according to means known in the art by one of ordinary skill using conventional photolithography techniques similar to those used to manufacture conventional bond pads.

Figure 3A:
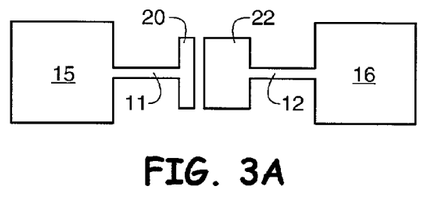
Figure 3B:
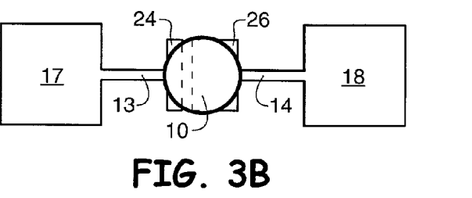

FIG. 3A depicts a second embodiment comprising a pad arrangement wherein the pads 20, 22 are of unequal size. This may be an advantage in uses where contact to one of the pads by a probe tip or other temporary connection is used to access the circuit portion connected therewith before electrically coupling the pads. By making pad 22 larger than pad 20, contact to pad 22 using a probe tip is facilitated while maintaining the outside perimeter of pads 20 and 22 and keeping the space required for the pads to a minimum. FIG. 3B depicts pads 24, 26 electrically coupled with a ball bond 10. Pads 24, 26 are electrically coupled via conductive runners 13, 14 to circuit portions 17 and 18. Thus by electrically coupling pads 24, 26, the circuit comprising circuit portions 17, 18 is completed.

Figure 4A:
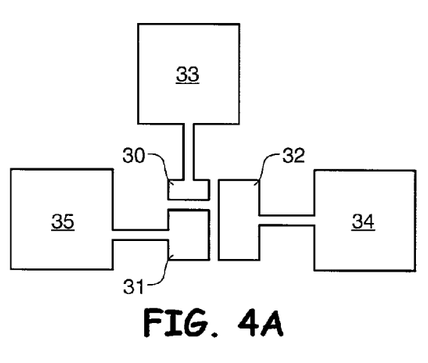
Figure 4B:
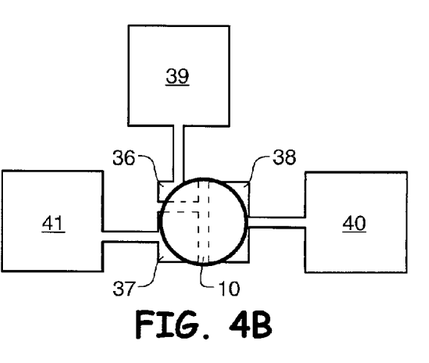

FIG. 4A depicts another embodiment comprising three pads 30, 31, 32. Each pad provides access to a portion of a single circuit, for a total of three circuit portions 33, 34, 35. FIG. 4B depicts a second similar structure comprising pads 36, 37, 38 electrically coupled to three circuit portions 39, 40, 41. Once ball bond 10 is attached to pads 36, 37, 38, the three portions of the circuit are electrically coupled and the circuit is completed and functional.

Figure 5:
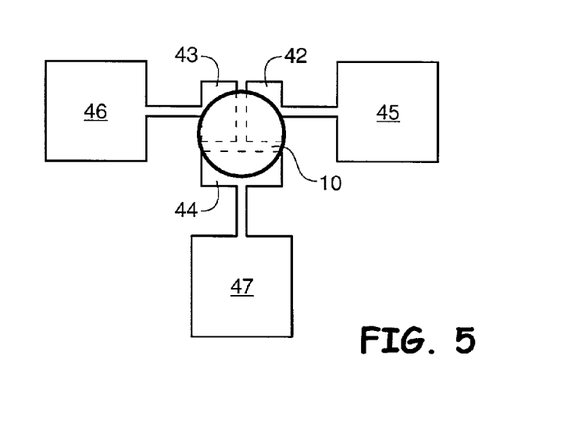

FIG. 5 depicts another arrangement of pads 42, 43, 44 which allows connection of three circuit parts 45, 46, 47 through the use of a ball bond 10 or another sufficient electrical connection.

Figure 6:
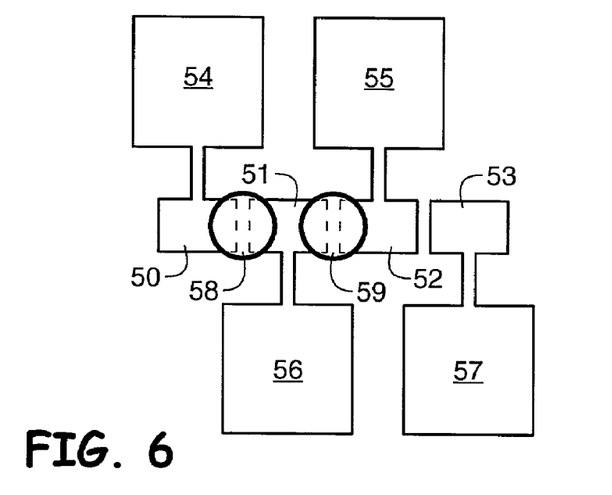

FIG. 6 depicts another arrangement of pads 50, 51, 52, 53 which facilitates selective connection of circuit portions 54, 55, 56, 57. In this embodiment, only circuit portions 54, 55, 56 are electrically coupled through ball bonds 58, 59 while pad 53 and thus circuit portion 57 remain electrically isolated from the other three circuit portions. This arrangement of pads is useful for customizing a circuit to operate in a particular way, rather than a two-pad embodiment which is either functional or not functional.

Figure 7:
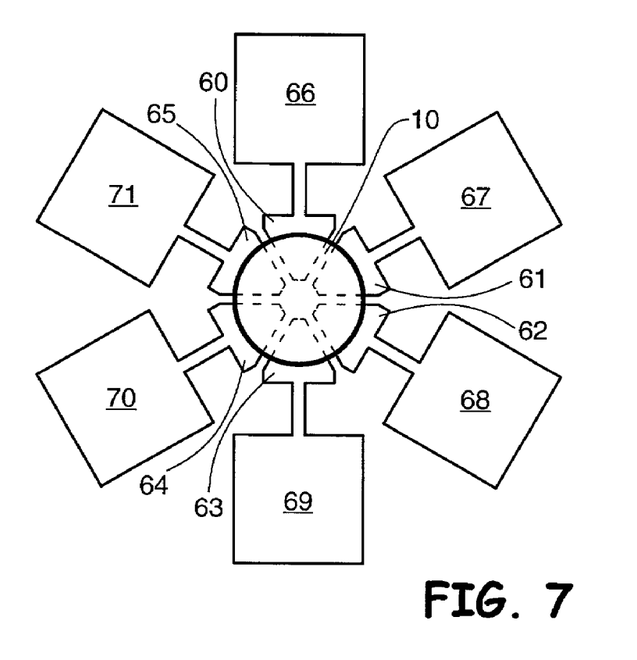

FIG. 7 depicts an arrangement of six pads 60–65 and six circuit portions 66–71 which may be connected with a single ball bond 10.

As discussed above in the "Background of the Invention" with reference to FIG. 1, antifuse devices may be used to replace malfunctioning rows or columns of DRAM storage capacitors with functional redundant rows or columns. With conventional antifuse device circuitry as depicted in FIG. 1, the voltage required to program the antifuses may eventually exceed the junction breakdown voltage of transistor T1. As such, CGND and thus the top antifuse plate could not be brought to a level which would program the antifuse in an acceptable period of time without damaging other transistors which may be connected to CGND for normal operation of the semiconductor device.

Figure 8:
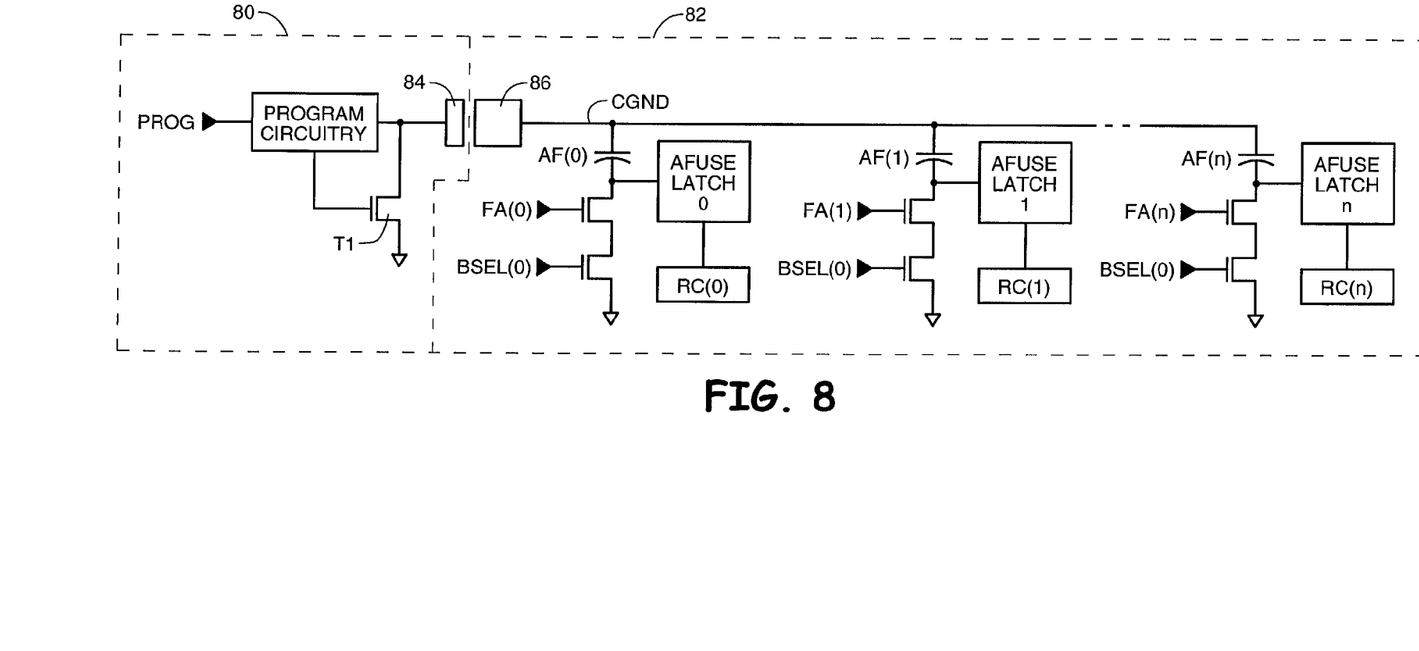
FIG. 8 is a block diagram depicting an antifuse circuit comprising segmented circuit portions which terminate in conductive pads.

FIG. 8 depicts one antifuse circuit implementation using the pad arrangement as depicted in FIG. 3 for use with antifuse devices. This implementation overcomes the breakdown voltage problem described for the FIG. 1 structure. FIG. 8 depicts an antifuse structure in which the antifuse circuit is segmented into two parts 80 and 82. Segment 80 terminates at pad 84, and segment 82 terminates at pad 86. To program the antifuse devices a voltage source available through a physical connection such as a probe tip (not depicted) is electrically coupled with pad 86, for example by physical contact with pad 86 in a manner typical of probe tips. In this embodiment, pad 86 is larger than pad 84 to provide a larger contact area for the probe tip while maintaining a small combined perimeter of pads 84, 86. To program antifuse AF(0), each of FA(0) and BSEL(0) are activated, thus grounding the lower plate of the antifuse, and a program voltage is applied to pad 86 through the probe tip or other connection. Because transistor T1 is electrically isolated from CGND, voltage breakdown of transistor T1 does not occur. Thus a voltage applied to CGND which is above the junction breakdown voltage of T1 does not bleed to the substrate as with the conventional circuit of FIG. 1 as described in the "Background of the Invention." After the antifuses are programmed a ball bond is formed which electrically couples pad 84 with pad 86 to complete the circuit.

This embodiment may also allow for the formation of fewer circuit devices on the circuit portion coupled with pad 84. In some devices fuses are programmed after encapsulation of the die, and in these devices the circuitry depicted would be required. In devices where programming fuses after encapsulating the semiconductor die is not enabled, some circuitry may not be necessary. For example, where fuse programming after die encapsulation is not enabled the program circuitry and transistor T1 are not necessary with the FIG. 8 structure, but rather pad 84 could be coupled directly with ground. Thus bonding pad 84 to pad 86 would tie CGND directly to ground. This would free up space for additional device circuitry, or allow for the formation of a smaller die.

It should be noted that the circuit of FIG. 8 would not allow proper operation of the semiconductor device without coupling of the two circuit portions. While the antifuse devices may be programmed without coupling the two pads 84, 86, proper functional replacement of nonfunctioning rows and columns with redundant rows and columns is not possible until coupling the two circuit portions to form a complete circuit.

Figure 9A:
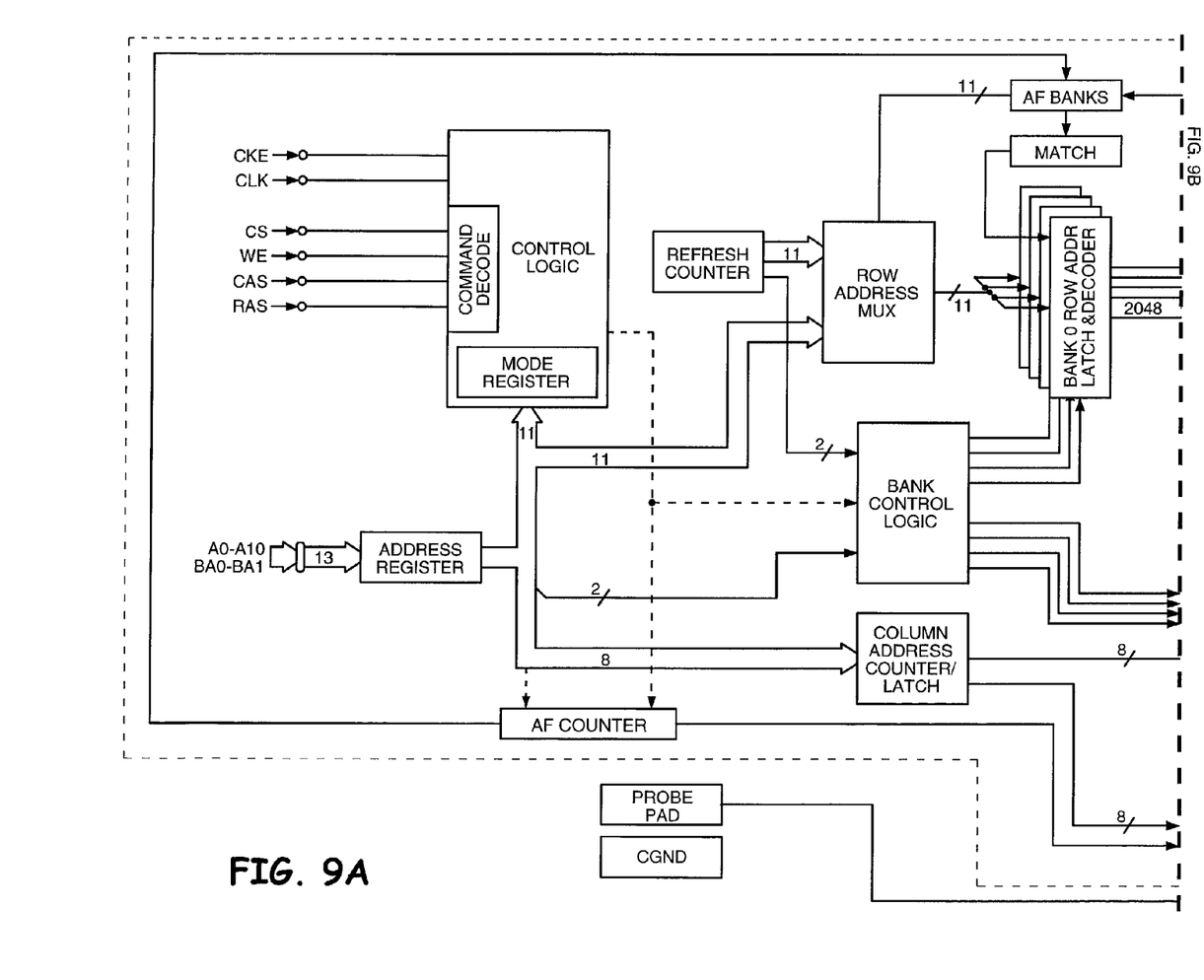
FIGS. 9A and 9B together comprise a block diagram depicting circuitry associated with an antifuse circuit implementing an embodiment of the invention.
Figure 9B:
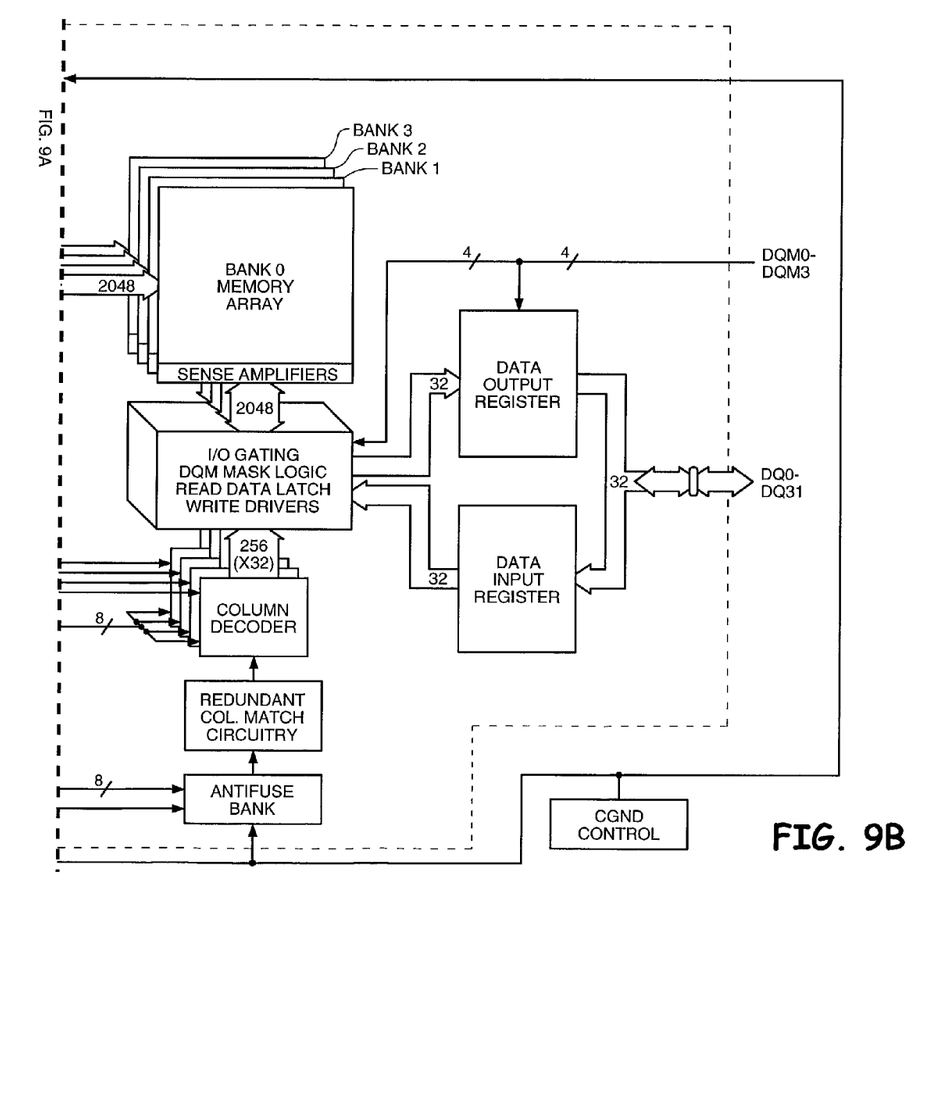

FIG. 9 is a block diagram depicting additional details of an antifuse circuit comprising an embodiment of the instant invention which overcomes problems of conventional antifuse circuitry.

Figures 10, 11, 12:
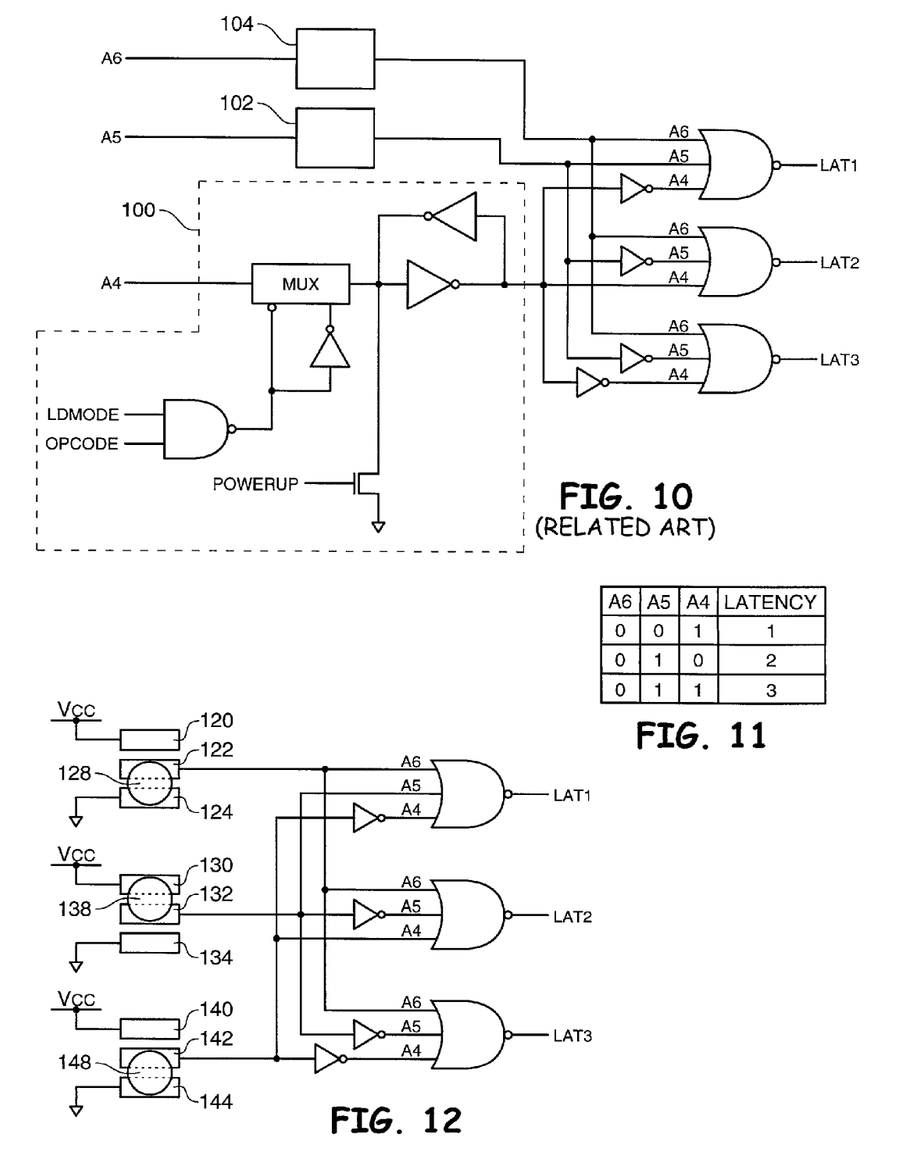
FIG. 10 is a conventional circuit associated with user-programmable device column address strobe (CAS) latency.
FIG. 11 is a table listing the latency selected by various combinations of addresses A4–A6 during mode register definition.
FIG. 12 depicts a circuit in accordance with an embodiment of the invention for hard wiring device latency during device manufacture.

Another inventive embodiment is described using FIGS. 10–12. Column Address Strobe (CAS) latency is the delay, in clock cycles, between the registration of a READ command and the availability of the fist piece of output data. For latency=2, two clock cycles from a data request until data is available on the data bus, and for latency=3, three clock cycles required until data is available. Electronic devices using memory such as synchronous dynamic random access memory (SDRAM) are typically manufactured such that device latency is programmable by the user during device powerup. FIG. 10 depicts a conventional circuit which allows user-selectable latency using addresses A4–A6. After Powerup, if LDMODE and OPCODE are both true, an address output on each of A4–A6 is used to set the latency. (Circuit portion 100 associated with address A4 is repeated in 102 and 104 for addresses A5 and A6 respectively, but have not been depicted in FIG. 10 for simplicity of explanation.) A "low" on all three inputs A4–A6 to one of the three nor gates is inverted to a "high" to set latency at either 1, 2, or 3. FIG. 11 is a table listing the three addresses available for output on A4–A6 to set latency to 1, 2, or 3. All other latency addresses which are not depicted are reserved.

To manufacture a device with which latency is not programmable by the user, different photolithography masks would typically be required for each latency. Mask sets can be expensive, require several weeks to manufacture, and add greatly to semiconductor device manufacturing costs.

An application and embodiment of the instant invention may be used to reduce or eliminate the need for separate masks for each device latency for devices which do not have user-programmable latency. FIG. 12 depicts an embodiment of the invention for selecting CAS latency after the wafer has been manufactured but before encapsulation.

Pads 120, 130, and 140 are coupled with $V_{CC}$, while pads 124, 134, and 144 are coupled with ground. By coupling pads 122, 132, and 142 to either their associated $V_{CC}$ or ground pad, the latency may be set before the semiconductor die is encapsulated. Pads 122, 132, and 142 are coupled to the nor gate inputs A6, A5, and A4 respectively. FIG. 12 further depicts a ball bond 128 coupling mini-pad 122 with mini-pad 124 (A6 to ground), and thus a low or "0" is output to each A6 nor gate input. Similarly, three pads 130, 132, 134 are used to select the A5 address input to each nor gate input. In this embodiment, pads 130 and 132 are electrically coupled with a ball bond 138, and thus a high or "1" is output to each A5 nor gate inputs. Similarly, pads 140, 142, 144 are used to select the A4 nor gate inputs. In this embodiment, pads 142 and 144 are electrically coupled with a ball bond 148, and thus a low or "0" is output to the A4 inputs. With the FIG. 12 embodiment a "0 1 0" is output on A6, A5, and A4 respectively. Factoring in the inverters located between pads 122, 132, 142 and each nor gate, a "high" is output only on LAT2 while a low is output on LAT1 and LAT3. Thus a latency of "2" is selected.

Once the ball bonds are formed, for example as depicted in the FIG. 12 embodiment to select a latency of "2," any other testing of the device is completed, the wafer is diced, and each die is encapsulated or otherwise packaged. The FIG. 12 structure may be modified for the selection of any device latency.

In the particular embodiment of FIG. 12, the A6 output 122 could be coupled directly with ground (i.e. hardwired directly to ground) as the state of A6 according to the table of FIG. 11 is always low (i.e. a latency of 1, 2, or 3 is determined using only addresses A5 and A4 since A6 is always "low"). Hardwiring the A6 output to ground would likely require less space than forming the three mini-pads 120, 122, 124 and forming ball bond 128.

In many process flows the ball bonds will be attached after dicing the wafer and prior to encapsulation. However, the ball bonds may also be attached prior to dicing the wafer.

Figure 13A:
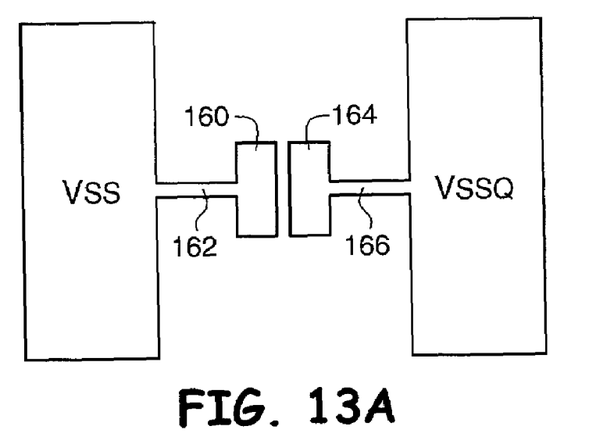
FIG. 13 is a block diagram depicting an embodiment of the invention to short $V_{SS}$ to $V_{SSQ}$ (13B) or to leave an open between $V_{SS}$ and $V_{SSQ}$ (13A)
Figure 13B:
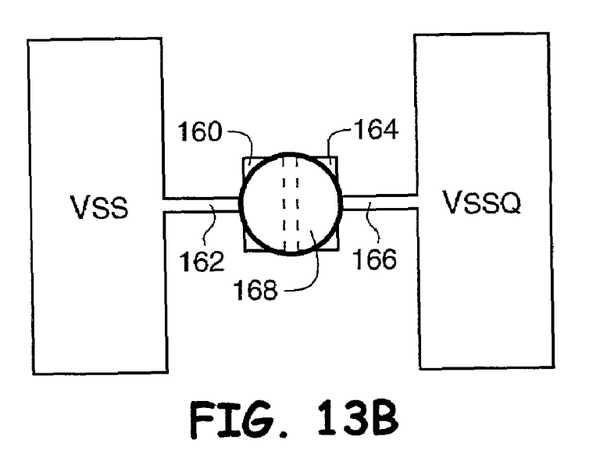

Another use and embodiment of the invention is depicted in FIGS. 13A and 13B to selectively alter internal power busing connections and, therefore, to selectively alter power operating characteristics. This exemplary embodiment comprises the selective coupling of $V_{SS}$ and $V_{SSQ}$, however the invention could be used equally well to selectively couple other internal power busing features. Further, as the connections are easily performed using ball bonds or other similar attachment means, these power busing configurations may be customized for a particular use of the semiconductor die after manufacturing the die but before encapsulation. As different internal power busing attachment configurations work with varying degrees of success with a particular use of the invention, optimizing the configuration for a specific use of the die is desirable but has previously required different photolithography masks for each particular attachment configuration. This use of the invention eliminates the requirement for different masks and process flows to accomplish this optimization.

Improving the performance of the device by internally tying together the $V_{SS}$ bus with the $V_{SSQ}$ bus is particularly useful in synchronous DRAM (SDRAM) manufacturing. This is especially true with devices which do not generate sufficient noise on the $V_{SSQ}$ to adversely affect the device by transferring excessive $V_{SSQ}$ noise to the $V_{SS}$ bus. Typically, devices which are configured to have a ×8 data width or less generate minimal noise and allow direct connection of the $V_{SSQ}$ bus to the $V_{SS}$ bus. Devices having a ×32 data width, however, produce excessive noise on the $V_{SSQ}$ bus and therefore require separate, noncoupled $V_{SSQ}$ (or multiple $V_{SSQ}$) and $V_{SS}$ busses. In conventional manufacturing technology, tying $V_{SS}$ and $V_{SSQ}$ together in some devices but not in others requires two different masks, one which ties $V_{SS}$ and $V_{SSQ}$ together in devices having a ×8 data width or less, for example through the use of a metal 2 mask feature, and one which does not tie the two together in devices having a data width greater than ×8. As previously stated, additional masks are expensive, add greatly to manufacturing costs, and also increase logistical complexity due to an increased number of process flows.

FIG. 13 depicts an inventive embodiment which allows electrical coupling of $V_{SS}$ and $V_{SSQ}$ in devices having a data with which allows coupling, and also allows electrical separation of $V_{SS}$ and $V_{SSQ}$ in devices which require their separation. This is accomplished using a single mask. In FIG. 13, the $V_{SS}$ circuit device comprises a pad 160 electrically coupled therewith through an interconnect 162. Further, $V_{SSQ}$ comprises a pad 164 electrically coupled therewith through an interconnect 166. In devices requiring separation of $V_{SS}$ and $V_{SSQ}$, pads 160 and 164 are not physically connected, as depicted in FIG. 13A. In devices where noise from electrically coupling $V_{SS}$ and $V_{SSQ}$ is not a concern, as depicted in FIG. 13B, a ball bond 168 or other connection means electrically couples pad 160 to pad 164.

Another embodiment of the invention comprises the selection of a device to operate as a fully-functional device or as a partially-functional device. It is well known in the art that, for example, a 64 megabit device may be configured internally as four 16 megabit arrays, eight 8 megabit arrays, etc. For example, one particular Micron Technology, Inc. 64 megabit SDRAM device (Micron part number MT48LC16M4A2, described in Micron's 64 megabit Synchronous DRAM data sheet 64MSDRAM_D, incorporated herein by reference) is configured as four 16 megabit arrays. Each 16 megabit array of this particular device is accessed using 4,096 (4K) rows and 1,024 (1K) columns, with four bits of data being written to or read from with each address. Each of the four individual banks is selected using a two-bit bank select. Additionally, one of Micron's 128 megabit SDRAM devices (Micron part number MT48LC32M4A2, described in Micron's 128 megabit Synchronous DRAM data sheet 128MSDRAM_E, incorporated herein by reference) is configured as four 32 megabit arrays. Each 32 megabit array is accessed using 4K rows and 2K columns, with four bits of data being written to or read from with each address.

Some array defects are so severe that the array cannot be repaired. These defective devices are often discarded or reworked and sold as "partial" (partially functional) devices devoted to special uses which do not require fully functional devices. With a conventional device, for example one having its storage capacitors configured as four arrays, a nonfunctioning quarter or half array is disabled, typically through the use of fuse or antifuse devices. A 128 megabit device having two of four arrays disabled would therefore supply 64 megabits of memory.

Figure 14:
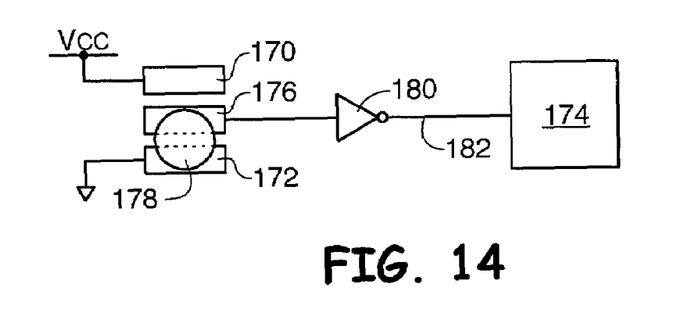
FIG. 14 depicts a circuit in accordance with an embodiment of the invention for selecting a semiconductor device to function as a 128 megabit device or as a 64 megabit device.

FIG. 14 depicts another inventive embodiment to configure a partial memory device using a pad arrangement similar to the one depicted in FIG. 2. With this embodiment, one pad 170 is electrically coupled with $V_{CC}$ and one is coupled with ground 172. If the storage elements 174 associated with pad 176 are determined to be functional or repairable, a ball bond 178 or other connection means couples pad 176 with ground to output a low which is inverted by inverter 180 to output a "high" on 182 and to enable storage elements 174. If the elements 174 are determined to be less than fully functional and not repairable, pad 176 is coupled with pad 170 to produce a low on 182 and to disable storage elements 174. There would likely be two or more circuits similar to the circuit of FIG. 14 for a storage array analogous to an array controlled by the interconnect storage array. For example, a 128 megabit device may be configured with four arrays and four FIG. 14 circuits, thereby allowing the 128 megabit device to supply 32 megabits, 64 megabits, 96 megabits, or 128 megabits, depending on the functionality of each array. In the case of Micron's 128 megabit device described above (Micron part number MT48LC32M4A2), each FIG. 14 circuit (in the case of four circuits) could selectively enable or disable 512 columns of the 2,048 columns described. It is likely that other circuits would function sufficiently using the ball bonds (or other connection means) described herein to selectively enable or disable only a portion of the memory elements of a memory device.

In contrast with conventional ball bonds and bond options discussed in the Background of the Invention, the functionality of the die with various embodiments of the present invention is not determined by an external controlled source, such as by whether a lead is coupled with power or ground. Functionality of a die with various embodiments of the present invention is instead determined by whether a ball bond is present and, if a ball bond is present, by which pads are physically connected by the ball bond or by the plurality of ball bonds. The functionality of the die is determined by the configuration of ball bonds, and cannot typically be altered once the pads have been shorted or left unconnected. Further, in contrast with conventional devices, the ball bonds of the invention do not connect the mini-pads with lead fingers of the lead frame or to other pads or traces external to the die, but rather connect the pads to other mini-pads on the die itself and to other circuitry on the die.

Further, wire bonds may be used to electrically couple the pads rather than the ball bonds previously described and depicted. In these embodiments it may be preferable to attach the wire bonds during a conventional wire bonding process during which bond pads are wire bonded to leads of a lead frame. In most process flows this wire bonding will occur subsequent to dicing of the wafer and prior to encapsulation or other assembly of the semiconductor die.

A semiconductor device comprising the invention may be attached along with other devices to a printed circuit board, for example to a computer motherboard or as a part of a memory module used in a personal computer, a minicomputer, or a mainframe. The inventive device may also be useful in other electronic devices related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method of manufacturing a semiconductor device, comprising:
    forming a first circuit and a second circuit on a semiconductor wafer substrate assembly;
    forming a first conductor connected to the first semiconductor circuit and a second conductor connected to the second semiconductor circuit, wherein the first conductor is electrically separated from the second conductor such that the first and second circuits are sufficiently isolated to provide protection to the second circuit;
    with the first and second circuits electrically separate from each other, performing an electrical operation on the first circuit with a voltage sufficient to damage the second circuit when applied to the first circuit with the first and second circuits electrically connected to each other;
    subsequent to performing the electrical operation on the first circuit, shorting the first and second conductors together to electrically couple the first and second circuits; and
    subsequent to shorting the first and second conductors together, encapsulating the semiconductor wafer substrate assembly.

2. The method of claim 1 further comprising shorting the first and second conductors together with a ball bond.

3. The method of claim 1 wherein the first and second circuits are fabricated such that the semiconductor device is inoperative if when the first and second conductors remain electrically separate subsequent to encapsulation.

4. The method of claim 1 further comprising:
    providing a lead frame; and
    subsequent to shorting the first and second conductors together, attaching the semiconductor wafer substrate assembly to the lead frame.

5. A method of manufacturing a memory device, comprising:

forming a plurality of primary and redundant memory cell locations;

forming antifuse circuitry which allows selection of the redundant memory cell locations;

forming voltage sensitive circuitry on the semiconductor wafer substrate assembly;

forming a first conductor electrically connected with the antifuse circuitry;

forming a second conductor electrically connected with the voltage sensitive circuitry, wherein the first and second conductors are electrically separated from each other;

while the first and second conductors are electrically separated, applying a voltage to the antifuse circuitry to program the antifuse circuitry, wherein the voltage is sufficient to damage the voltage sensitive circuitry when applied to the antifuse circuitry when the first and second conductors are electrically connected; and subsequent to programming the antifuse circuitry, electrically shorting the first conductor with the second conductor.

6. The method of claim 5 further comprising encapsulating the antifuse circuitry, the voltage sensitive circuitry, the first conductor, and the second conductor subsequent to electrically shorting the first conductor with the second conductor.

7. The method of claim 5 further comprising electrically shorting the first conductor with the second conductor using a ball bond.

8. The method of claim 5 wherein the antifuse circuitry and the voltage sensitive circuitry are fabricated such that the memory device is inoperative if the first and second conductors remain electrically separated.

9. The method of claim 5 further comprising:

providing a lead frame; and subsequent to bridging the physical opening, attaching the semiconductor wafer substrate assembly to the lead frame.

10. A method of manufacturing a memory device comprising:

fabricating first and second circuits on a semiconductor wafer substrate assembly, wherein the first and second circuits are adapted to be electrically connected through a common conductor;

fabricating the common conductor with a physical opening to provide an open circuit between the first and second circuits, such that the first circuit is sufficiently isolated from the second circuit to provide protection for the first circuit from a voltage applied to the second circuit which is sufficient to damage the first circuit when applied to the second circuit with the physical opening bridged;

applying the voltage to the second circuit; and subsequent to applying the voltage to the second circuit, bridging the physical opening of the common conductor to electrically connect the first and second circuits together.

11. The method of claim 10 further comprising encapsulating the first and second circuits and the common conductor subsequent to bridging the physical opening.

12. The method of claim 10 further comprising bridging the physical opening with a ball bond.

13. The method of claim 10 wherein the first and second circuits are fabricated such that the memory device is inoperative if the physical opening remains unbridged.

14. The method of claim 10 further comprising:

providing a lead frame; and subsequent to bridging the physical opening, attaching the semiconductor wafer substrate assembly to the lead frame.

* * * * *